(12) United States Patent
Ko et al.

(10) Patent No.: US 10,312,100 B2
(45) Date of Patent: Jun. 4, 2019

(54) CONDUCTOR INCLUDING NANO-PATTERNED SUBSTRATE AND METHOD OF MANUFACTURING THE CONDUCTOR

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Wonhee Ko, Seoul (KR); Hyowon Kim, Seongnam-si (KR); Jiyeon Ku, Suwon-si (KR); Donggyu Kim, Daejeon (KR); Seunghwa Ryu, Daejeon (KR); Seongjun Jeong, Hwaseong-si (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 42 days.

(21) Appl. No.: 15/334,684

(22) Filed: Oct. 26, 2016

(65) Prior Publication Data

US 2017/0117399 A1    Apr. 27, 2017

(30) Foreign Application Priority Data

Oct. 26, 2015    (KR) .................. 10-2015-0148827

(51) Int. Cl.
*H01L 21/20* (2006.01)
*H01L 21/306* (2006.01)
(Continued)

(52) U.S. Cl.
CPC .. *H01L 21/30604* (2013.01); *H01L 21/02524* (2013.01); *H01L 21/3085* (2013.01); *H01L 29/413* (2013.01)

(58) Field of Classification Search
CPC . B82Y 40/00; H01L 29/1606; H01L 29/7786; H01L 29/0665; H01L 29/0669;
(Continued)

(56) References Cited

U.S. PATENT DOCUMENTS

| 8,685,768 B2* | 4/2014 | Huh .................. H01L 51/5268 257/40 |
| 2011/0266577 A1* | 11/2011 | Kim .................. H01L 51/5271 257/98 |

(Continued)

FOREIGN PATENT DOCUMENTS

| KR | 10-1356010 B1 | 1/2014 |
| KR | 10-1437639 B1 | 9/2014 |
| KR | 10-2016-0051158 A | 5/2016 |

*Primary Examiner* — Kevin M Picardat
(74) *Attorney, Agent, or Firm* — Sughrue Mion, PLLC

(57) ABSTRACT

A conductor including a graphene layer and a method of manufacturing the conductor are provided. The conductor may further include a nano pattern disposed on a substrate, and the graphene layer may be formed on the nano pattern. The nano pattern may have any various shapes and include a material that interacts with the graphene layer. The nano pattern and the graphene layer included in the conductor may interact with each other, such that the electric characteristics of the conductor are maintained while the heat transfer characteristics thereof are improved.

15 Claims, 22 Drawing Sheets

(51) Int. Cl.
*H01L 21/02* (2006.01)
*H01L 21/308* (2006.01)
*H01L 29/41* (2006.01)

(58) Field of Classification Search
CPC .......... H01L 29/0673; H01L 21/02524; H01L 21/3083; H01L 21/3085
USPC ....................................................... 257/194
See application file for complete search history.

(56) References Cited

U.S. PATENT DOCUMENTS

| | | | |
|---|---|---|---|
| 2012/0305966 A1* | 12/2012 | Shin | H01L 51/0096 257/98 |
| 2013/0059134 A1* | 3/2013 | Chai | B82Y 10/00 428/201 |
| 2013/0078436 A1* | 3/2013 | Naito | H05B 33/28 428/196 |
| 2013/0273315 A1 | 10/2013 | Mansky et al. | |
| 2014/0167085 A1* | 6/2014 | Lee | H01L 27/3295 257/98 |
| 2015/0155216 A1* | 6/2015 | Kim | H01L 23/3171 257/737 |
| 2015/0306550 A1* | 10/2015 | Lee | B01D 71/021 210/500.21 |
| 2015/0340659 A1* | 11/2015 | Shin | H01L 51/5268 257/40 |
| 2016/0122189 A1 | 5/2016 | Ku et al. | |

\* cited by examiner

CONDUCTOR INCLUDING NANO-PATTERNED SUBSTRATE AND METHOD OF MANUFACTURING THE CONDUCTOR

CROSS-REFERENCE TO RELATED APPLICATION

This application claims priority from Korean Patent Application No. 10-2015-0148827, filed on Oct. 26, 2015, in the Korean Intellectual Property Office, the disclosure of which is incorporated herein in its entirety by reference.

BACKGROUND

1. Field

Apparatuses and methods consistent with exemplary embodiments relate to conductors including a nano-patterned substrate and methods of manufacturing the conductors.

2. Description of the Related Art

In the related art, a conductive wire formed of a metal material is connected to a device so as to transmit electricity inside the device or between devices. Although the conductive wire formed of a metal material may have very high electrical conductivity, since the conductive wire also has high heat conductivity, heat generated inside the device may be transferred to a part of the device to which a user does not want the heat to be transferred. If the heat generated within the device is transferred to a part of the device to which a user does not want the heat to be transferred, an apparatus including the device may malfunction, and furthermore, the safety of the user may be jeopardized.

SUMMARY

One or more exemplary embodiments provide conductors including a nano-patterned substrate, in which heat transfer characteristics are improved and methods of manufacturing the conductors.

Additional exemplary aspects and advantages will be set forth in part in the description which follows and, in part, will be apparent from the description, or may be learned by practice of the exemplary embodiments.

According to an aspect of an exemplary embodiment, a conductor includes: a substrate; a nano pattern disposed on the substrate; and a graphene layer disposed over the nano pattern.

The nano pattern may include a plurality of linear structures, each extending in a same direction, and the plurality of linear structures may be spaced apart from each other.

The nano pattern may include a regularly-spaced lattice.

The nano pattern may include an irregularly-spaced lattice.

The substrate and the nano pattern may include same material.

The substrate and the nano pattern may include one or more of silicon dioxide ($SiO_2$), aluminum oxide ($Al_2O_3$), glass, platinum (Pt), copper (Cu), silver (Ag), and gold (Au).

The substrate and the nano pattern may be formed of different materials.

The substrate may include one or more of $SiO_2$, $Al_2O_3$, and glass, and the nano pattern may include one or more of Pt, Cu, Ag, nickel (Ni), cobalt (Co), titanium (Ti), and gold (Au).

The nano pattern may include a plurality of first pattern elements alternately arranged with a plurality of second pattern elements.

The first pattern unit may include one or more of Pt, Cu, Ag, and Au, and the second pattern unit may include one or more of Ni, Co, and Ti.

According to an aspect of another exemplary embodiment, a conductor includes: a substrate; a nano pattern disposed on the substrate; and a two-dimensional (2D) material layer disposed over the nano pattern.

The 2D material layer may include one or more of molybdenum disulfide ($MoS_2$) and tungsten disulfide ($WS_2$).

According to an aspect of another exemplary embodiment, a method of manufacturing a conductor includes: depositing a mask layer over a substrate; removing a part of the mask layer thereby forming at least one opening in the mask layer, such that a remaining portion of the mask layer forms a nano pattern; etching the substrate through the at least one opening in the mask layer; removing the remaining portion of the mask layer; and forming a graphene layer over the substrate.

The mask layer may be a block copolymer film including a first plurality of polymer blocks and a second plurality of polymer blocks.

Removing the part of the mask layer comprises removing the first plurality of polymer blocks, and the second plurality of polymer blocks may form the nano pattern.

The nano pattern may include linear structures extending in a direction, wherein the linear structures are separated from each other by a certain distance.

The nano pattern may include a regularly-spaced lattice.

The nano pattern may include an irregularly-spaced lattice.

The method may further include depositing a metal layer over the etched substrate.

The substrate may include one or more of silicon dioxide ($SiO_2$), aluminum oxide ($Al_2O_3$), and glass, and the metal layer may include one or more of platinum (Pt), copper (Cu), silver (Ag), nickel (Ni), cobalt (Co), titanium (Ti), and gold (Au).

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
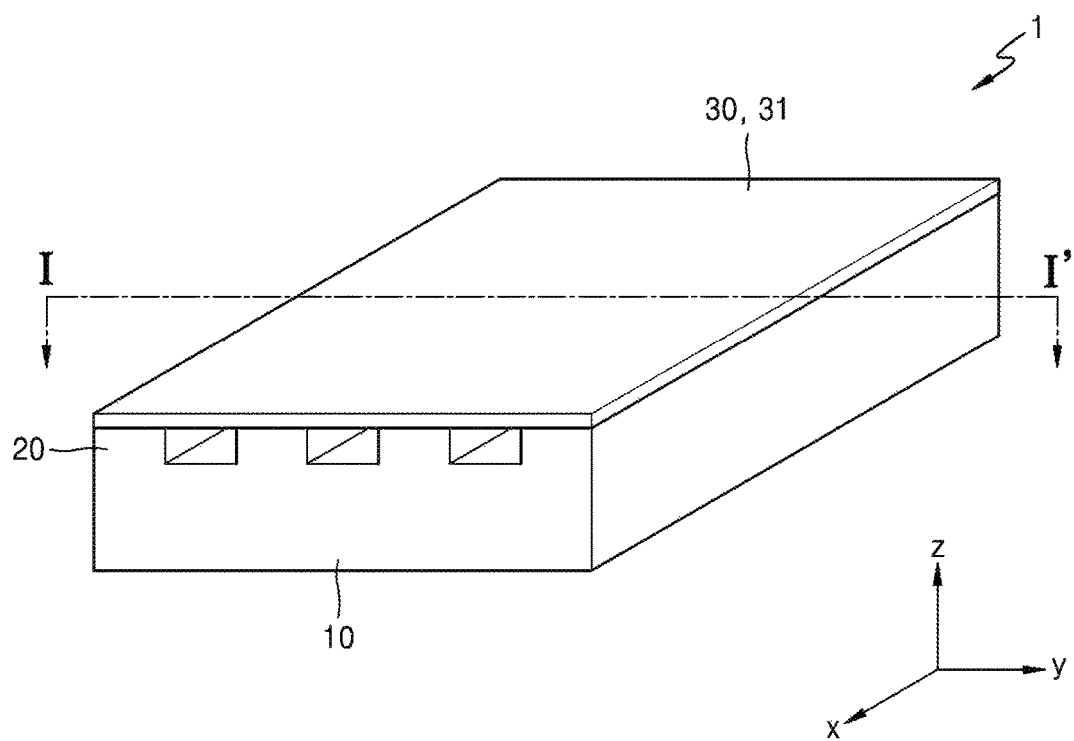
FIG. 1 is a perspective view of a conductor according to an exemplary embodiment.

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. Expressions such as "at least one of," when preceding a list of elements, modify the entire list of elements and do not modify the individual elements of the list.

Hereinafter, according to an exemplary embodiment, a conductor and a method of manufacturing the same will be described in detail with reference to the accompanying drawings. In the drawings, the lengths and sizes of layers and regions may be exaggerated for clarity. Like reference numerals in the drawings denote like elements, and thus their description will be omitted.

Figure 2:
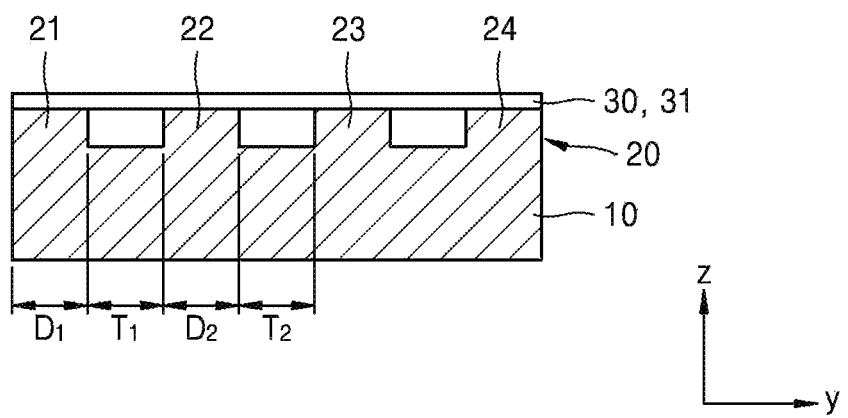
FIG. 2 is a cross-sectional view of the conductor taken along a line I-I' shown in FIG. 1.
Figure 3:
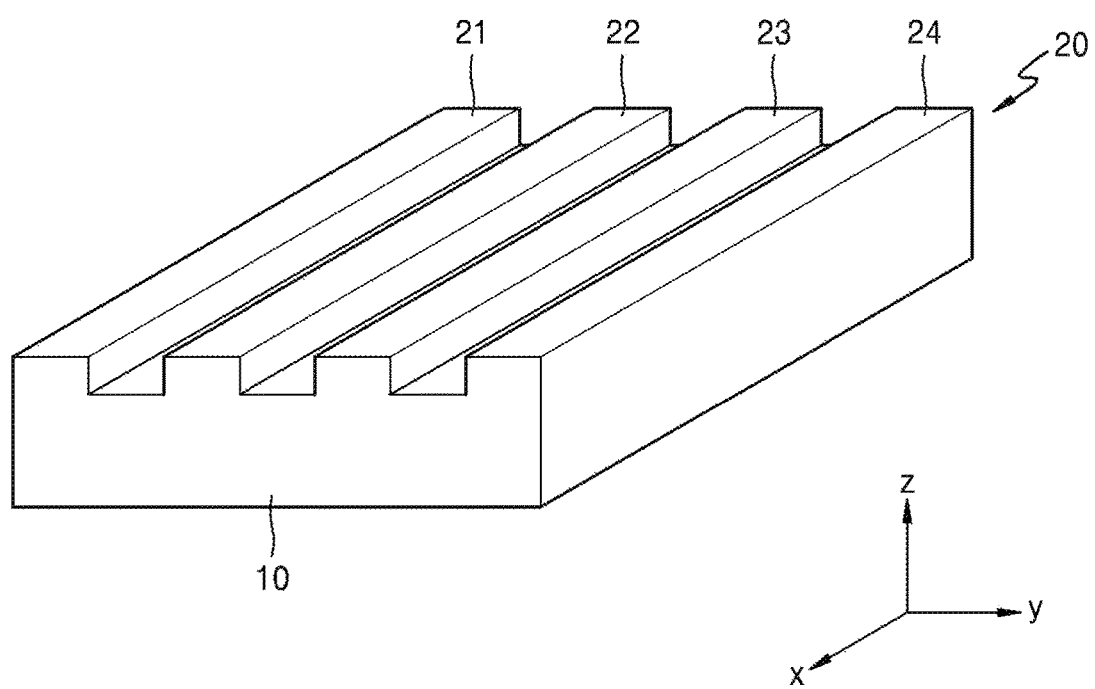
FIG. 3 is a perspective view of a substrate that includes a nano pattern, according to an exemplary embodiment.

FIG. 1 is a perspective view of a conductor 1 according to an exemplary embodiment. FIG. 2 is a cross-sectional view of the conductor 1 taken along a line I-I' shown in FIG. 1. FIG. 3 is a perspective view of a substrate 10 that includes a nano pattern 20, according to an exemplary embodiment.

Referring to FIGS. 1 through 3, according to an exemplary embodiment, the conductor 1 may include a substrate 10, a nano pattern 20 disposed on or formed in the substrate 10, and a graphene layer 30 disposed on the nano pattern 20. The substrate 10 is a flat-plate member that may support the graphene layer 30. As an example, the substrate 10 may include a non-conductor that does not effect the an electronic structure of the graphene layer 30. For example, the substrate 10 may include silicon dioxide ($SiO_2$), aluminum oxide ($Al_2O_3$), or glass, or metal with a weak interaction with the graphene layer 30, for example, platinum (Pt), copper (Cu), silver (Ag), gold (Au), or the like. However, exemplary embodiments are not limited thereto, and the substrate 10 may include a conductor, a semiconductor, or a non-conductor.

The nano pattern 20 may be disposed between the substrate 10 and the graphene layer 30 or may be formed in an upper surface of the substrate 10 on which the graphene layer 30 is disposed, and may include one or more patterns having widths D (see FIG. 2) of a few through tens of nm. The one or more patterns included in the nano pattern 20 may have a regular structure or an irregular structure.

According to an exemplary embodiment, as shown in FIGS. 2 and 3, first through fourth patterns 21 through 24 may each have a linear structure extending in a first direction X. The first through fourth patterns 21 through 24 may be separated from each other by distances T of a few through tens of nm. Widths D of the first through fourth patterns 21 through 24 may be identical to or different from each other, and certain distances T between the first through fourth patterns 21 through 24 may be identical to or different from each other. For example, a first width $D_1$ and a second width $D_2$ of the first and second patterns 21 and 22, respectively, may be equal to or different from each other, and the first distance $T_1$ between the first and second patterns 21 and 22 and the second distance $T_2$ between the second and third nano patterns 22 and 23, respectively, may be equal to or different from each other. Accordingly, one or more patterns included in the nano pattern 20 may be disposed on the substrate 10 and have regular or irregular structures. Additionally, the nano pattern 20 may include a same material as that of the substrate 10, or a material different from that of the substrate 10.

The graphene layer 30 may comprise a single-layered hexagonal structure including carbon atoms and having excellent electrical characteristics such as a charge mobility of about $2 \times 10^5$ $cm^2$/Vs, which is 100 times or more faster than that of silicon (Si), and a current density of about $10^8$ A/cm which is 100 times or more greater than that of Cu. As an example, as shown in FIG. 2, the graphene layer 30 may be disposed on the nano pattern 20. In this case, movement of phonons P that control the conduction of heat in the graphene layer 30 may be obstructed by interaction between the graphene layer 30 and the nano pattern 20, and thus, heat conductivity characteristics of the graphene layer 30 may deteriorate. However, movement of electrons of the graphene layer 30 may not be effected by the interaction between the graphene layer 30 and the nano pattern 20. Accordingly, the electrical characteristics of the graphene layer 30 may be maintained.

As another example, a two-dimensional (2D) material layer 31 may be disposed on the nano pattern 20 in place of the graphene layer 30. The 2D material layer 31 may be a thin film and may include a 2D material that includes a 2D nano structure, for example, molybdenum disulfide ($MoS_2$), tungsten disulfide ($WS_2$), or the like. Heat conductivity characteristics of the 2D material layer 31 may deteriorate due to interaction between the 2D material layer 31 and the nano pattern 20. Hereinafter, a conductor 1 that includes the graphene layer 30 is described for convenience of description.

Figure 4A:
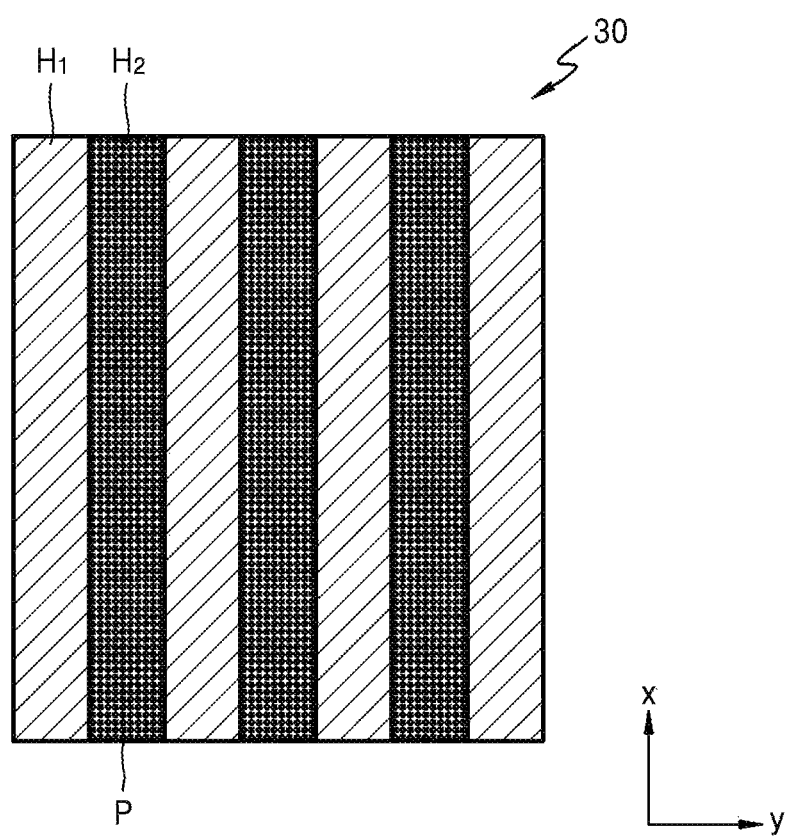
FIG. 4A is a plan view of a conductor which schematically shows a distribution of phonons P in an in-mode state, according to an exemplary embodiment.
Figure 4B:
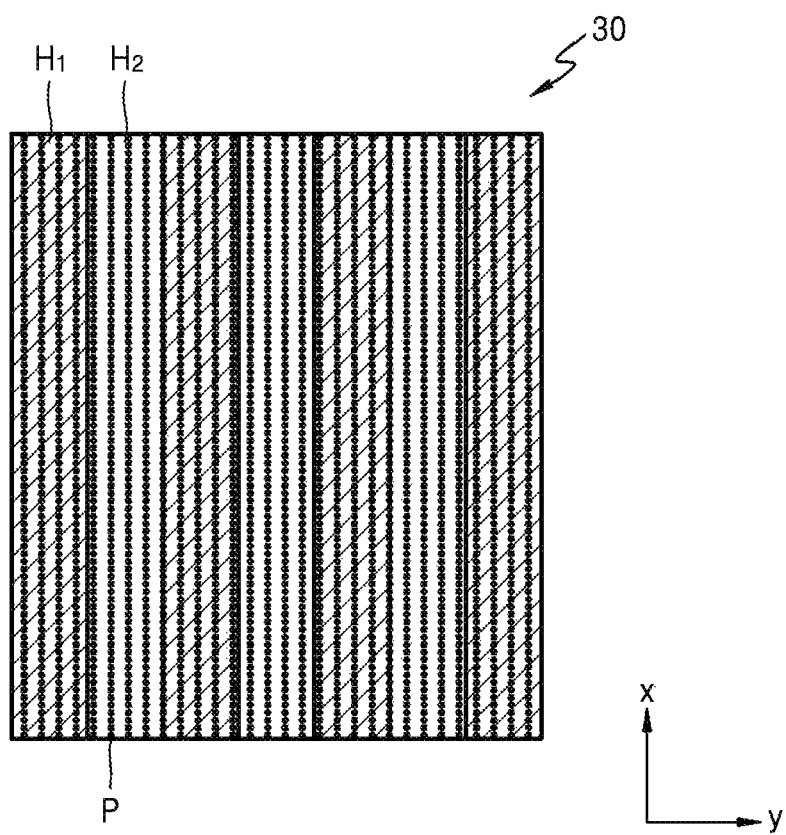
FIG. 4B is a plan view of a conductor which schematically shows a distribution of phonons P in an out-mode state, according to an exemplary embodiment.
Figure 5A:
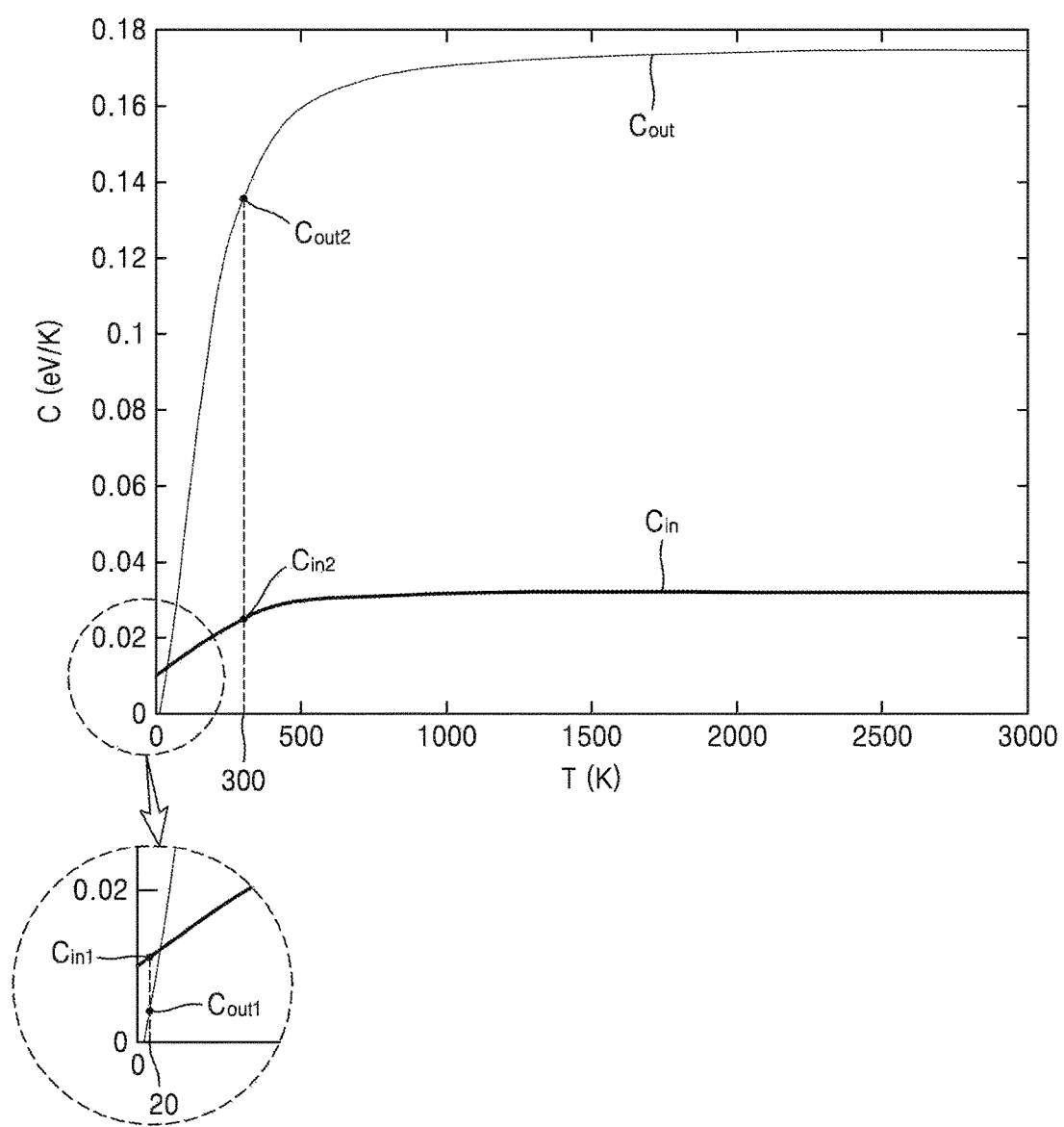
FIG. 5A is a graph showing a change in a heat capacity of a graphene layer according to temperature, with respect to the phonons in an in-mode state and those in an out-mode state, according to an exemplary embodiment.
Figure 5B:
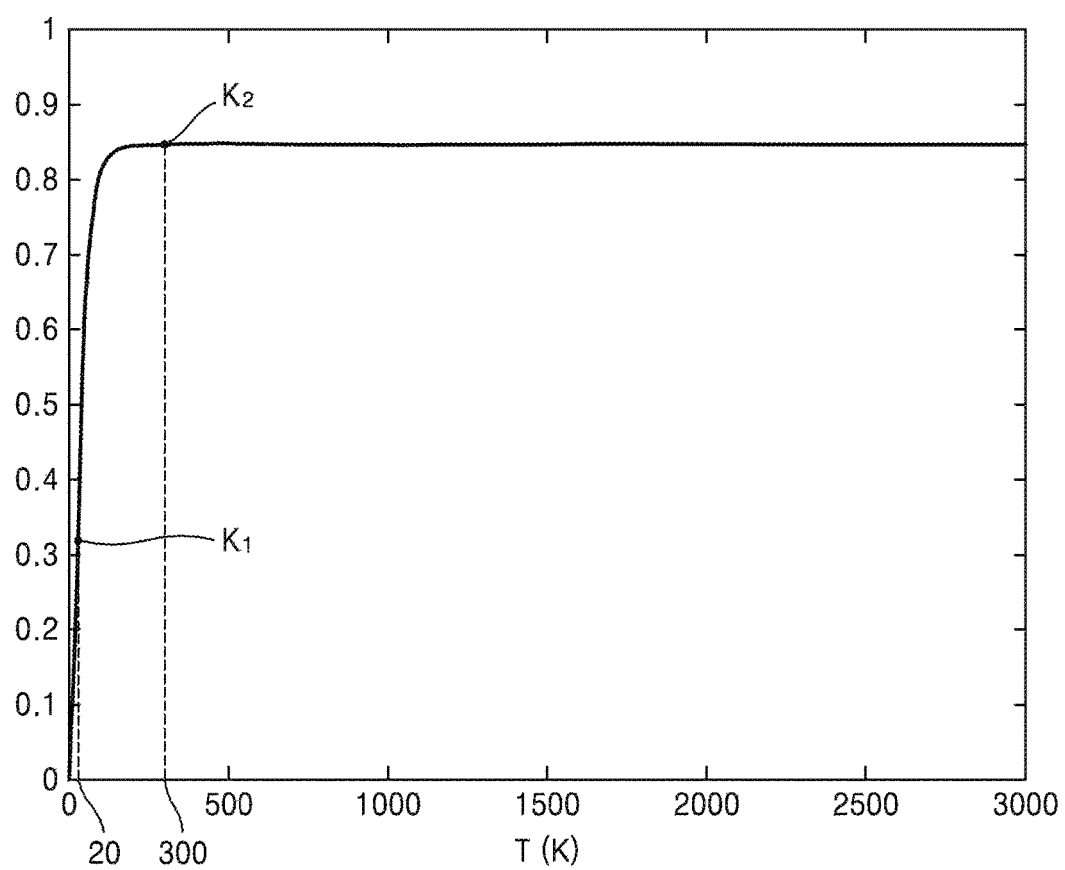
FIG. 5B is a graph showing a ratio of a heat capacity of a graphene layer in which the nano pattern is formed to a heat capacity of the graphene layer in which no nano pattern is formed, according to temperature, with respect to the phonons in an in-mode state and those in an out-mode state, according to an exemplary embodiment.
Figure 5C:
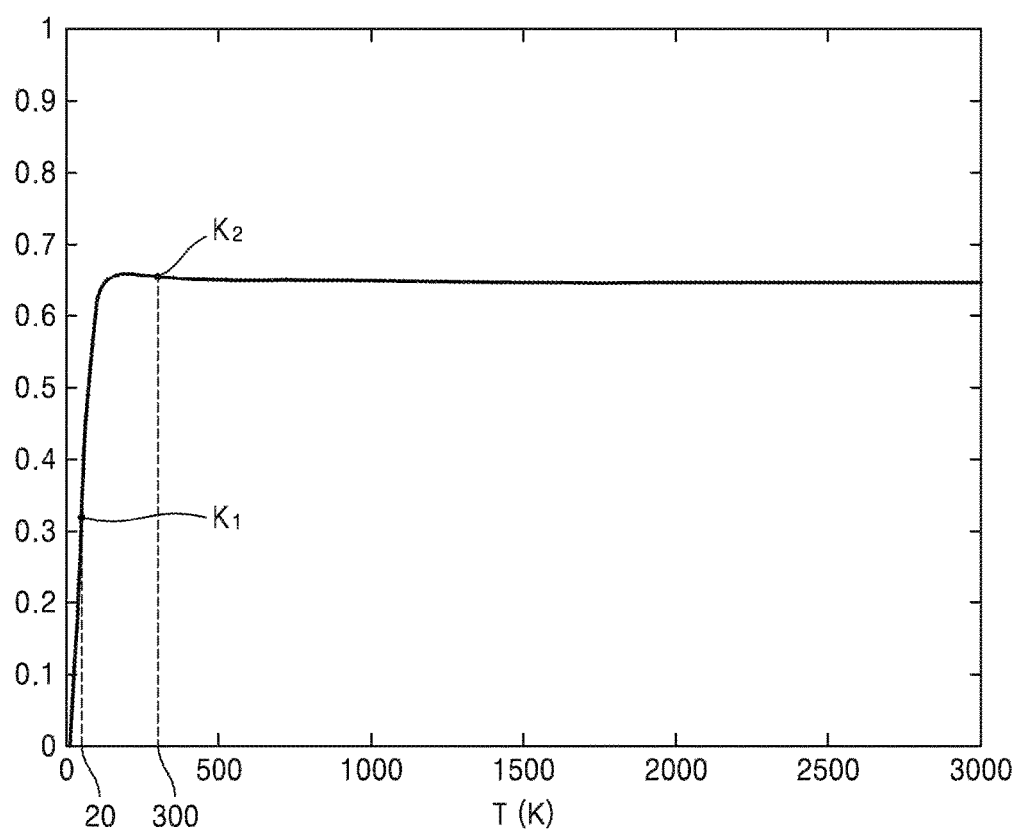
FIG. 5C is a graph showing a ratio of a heat capacity of a graphene layer in which the nano pattern is formed to a heat capacity of the graphene layer in which no nano pattern is formed, according to temperature, with respect to the phonons in an in-mode state and those in an out-mode state, according to another exemplary embodiment.

FIG. 4A is a plan view of a conductor which schematically shows a distribution of phonons P in an in-mode state, according to an exemplary embodiment. FIG. 4B is a plan view of the conductor which schematically shows a distribution of the phonons P in an out-mode state, according to an exemplary embodiment. FIG. 5A is a graph showing a change in a heat capacity of the graphene layer 30 according to temperature, with respect to the phonons in the in-mode state and those in the out-mode state. FIG. 5B is a graph showing a ratio of a heat capacity of a graphene layer in which the nano pattern 20 is formed to a heat capacity of the graphene layer 30 in which no nano pattern 20 is formed according to temperature, with respect to the phonons in the in-mode state and those in the out-mode state, according to an exemplary embodiment. FIG. 5C is a graph showing a ratio of a heat capacity of the graphene layer 30 in which the nano pattern 20 is formed to a heat capacity of the graphene layer 30 in which no nano pattern 20 is formed according to temperature, with respect to the phonons in the in-mode state and those the out-mode state, according to another exemplary embodiment.

Referring to FIGS. 4A and 4B, if the nano pattern 20 is disposed on the substrate 10 as shown in FIG. 1, a distribution of the phonons P in a first area $H_1$ of the graphene layer 30, which is an area which contacts the nano pattern 20, may be different from a distribution of the phonons P in a second area $H_2$ of the graphene layer 30, which is an area which does not contact the nano pattern 20. As an example, the phonons P may be concentrated in the second area $H_2$ of the graphene layer 30 in the in-mode state and, accordingly, the phonons P may not be disposed in the first area $H_1$ of the graphene layer 30. Since propagation of the phonons P is needed so as to transfer heat through the graphene layer 30, heat may not be transferred through the graphene layer 30 in a second direction Y by the phonons in the in-mode state because the phonons in the in-mode state are concentrated in the second area $H_2$ of the graphene layer 30. However, since the phonons P in the out-mode state may be evenly distributed in the first area $H_1$ and the second area $H_1$ of the graphene layer 30, as shown in FIG. 4B, heat may be conducted through the graphene layer 30 by the phonons in the out-mode state. Accordingly, heat transfer characteristics in the second direction Y, of a graphene layer 30 which includes phonons in the in-mode state, formed by the nano pattern 20 may be worse than heat transfer characteristics in the second direction Y of a graphene layer 30 that does not include phonons in the in-mode state formed by the nano pattern 20.

A ratio (of heat transfer characteristics, for example) between phonons in the in-mode state and those in the out-mode state of the graphene layer 30 may change with a degree of the interaction between the nano pattern 20 and the graphene layer 30. As an example, if the nano pattern 20 is formed of Pt, a heat capacity C of the graphene layer 30 may be different for phonons in the in-mode state as compared to those in the out-mode state shown in FIG. 5A. If a temperature is 20K $K_1$, since a heat capacity $C_{in1}$ of the graphene layer 30, with respect to the phonons in the in-mode state, is greater than a heat capacity $C_{out1}$ of the graphene layer 30 with respect to the phonons in the out-mode state, heat transfer characteristics of the graphene layer 30 in the second direction Y may deteriorate greatly as to those of a graphene layer 30 on which the nano pattern 20 is not formed, as shown in FIG. 5B. However, if a temperature is 300K $K_2$ or greater, since a heat capacity $C_{in2}$ of the graphene layer 30 with respect to the phonons in the in-mode state is smaller than a heat capacity $C_{out2}$ of the graphene layer 30 with respect to the phonons in the out-mode state, it may be understood that heat transfer characteristics of the graphene layer 30 in the second direction Y deteriorate less than that of the graphene layer 30 on which the nano pattern 20 is not formed, as shown in FIG. 5B.

If an interaction between the nano pattern 20 and the graphene layer 30 is large, a ratio of the phonons in the in-mode state to those in the out-mode state may increase and, accordingly, the heat transfer characteristics of the graphene layer 30 may deteriorate significantly. As an example, if the nano pattern 20 is formed of nickel (Ni), the phonons in the in-mode state may take up a larger part of the graphene layer 30 as compared to those in the out-mode state. Accordingly, heat transfer characteristics of the graphene layer 30 on which the nano pattern 20 is formed may deteriorate significantly as compared to the graphene layer 30 on which the nano pattern 20 is not formed, as shown in FIG. 5C.

Figure 6:
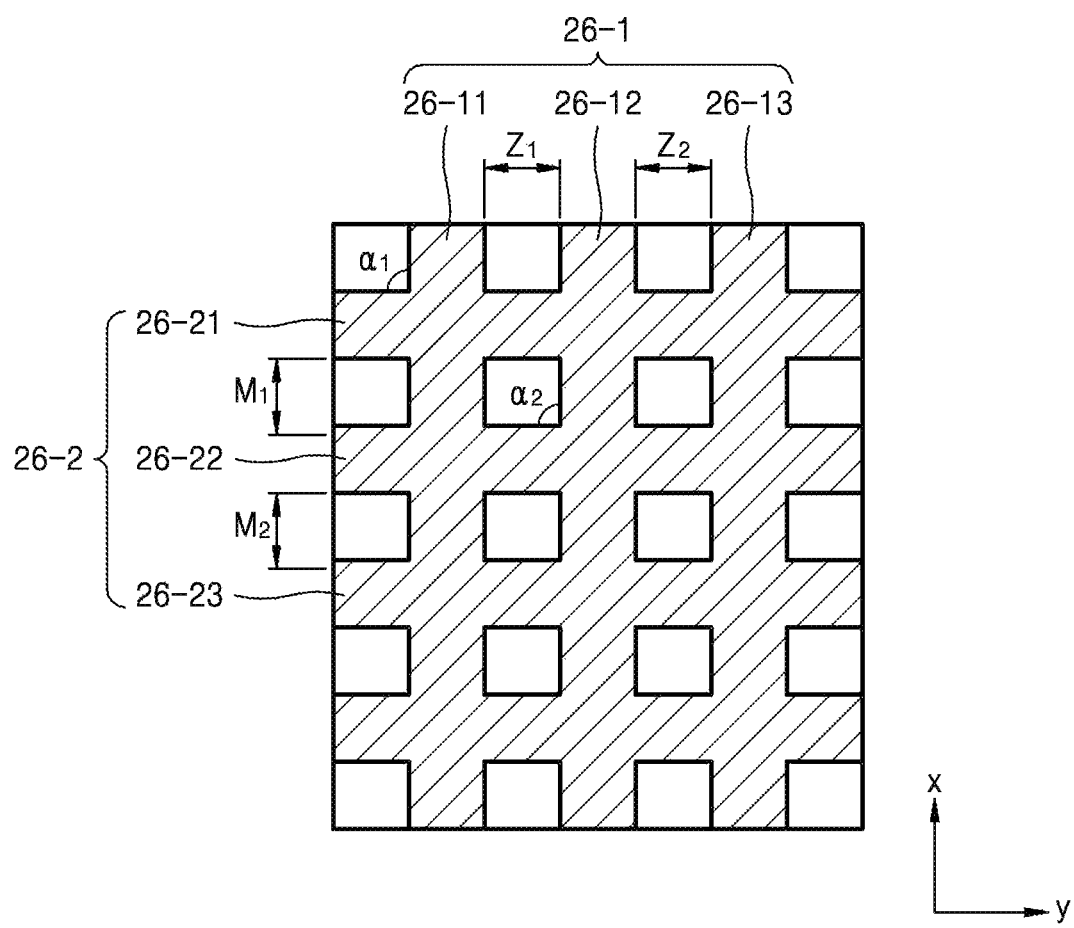
FIG. 6 is a plan view of a nano pattern according to another exemplary embodiment.
Figure 7:
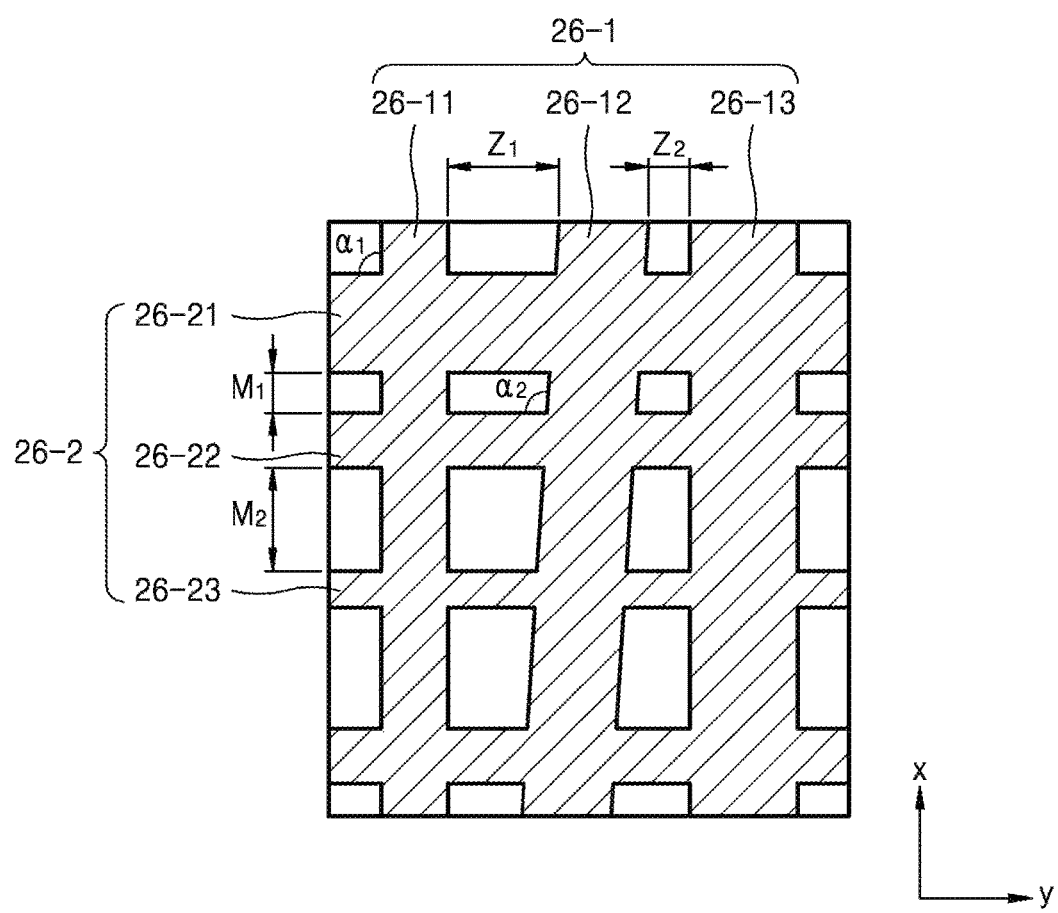
FIG. 7 is a plan view of a nano pattern according to another exemplary embodiment.
Figure 8:
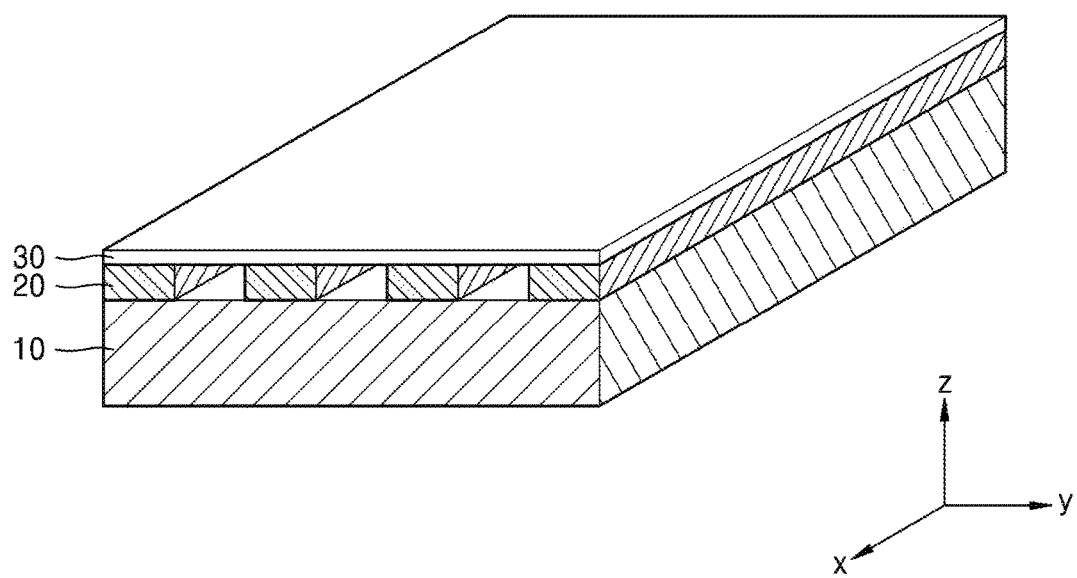
FIG. 8 is a perspective view of a conductor according to another exemplary embodiment.
Figure 9A:
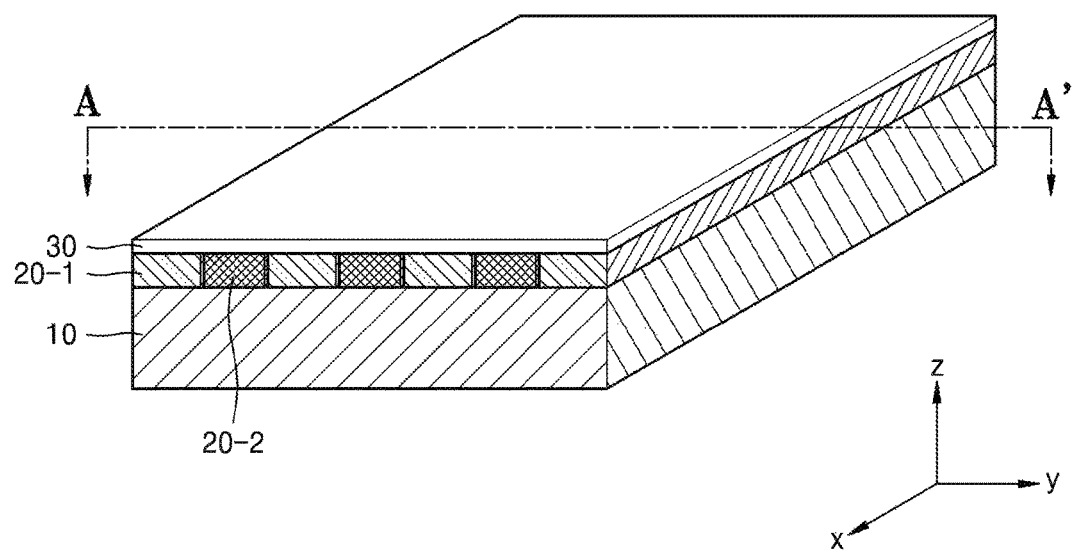
FIG. 9A is a perspective view of a conductor according to another exemplary embodiment.
Figure 9B:
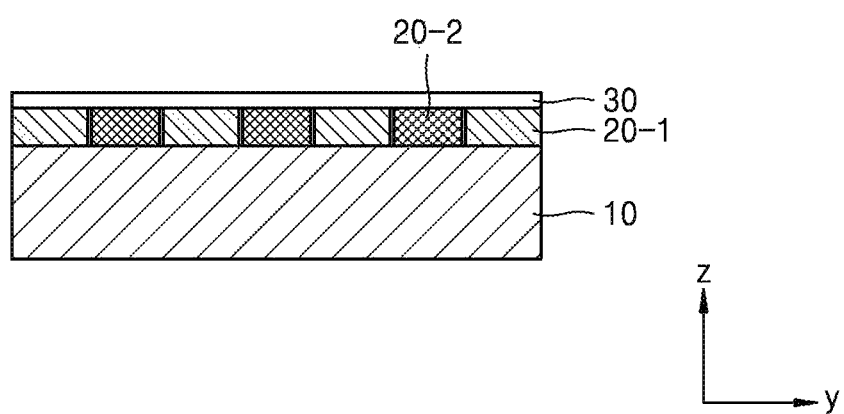
FIG. 9B is a cross-sectional view of the conductor taken along a line A-A' shown in FIG. 9A.

FIG. 6 is a plan view of the nano pattern 20 according to another exemplary embodiment. FIG. 7 is a plan view of the nano pattern 20 according to another exemplary embodiment. FIG. 8 is a perspective view of a conductor according to another exemplary embodiment. FIG. 9A is a perspective view of a conductor according to another exemplary embodiment. FIG. 9B is a cross-sectional view of the conductor taken along a line A-A' shown in FIG. 9A.

As shown in FIG. 3, the nano pattern 20 may be formed to have a linear structure that includes a plurality of patterns 21 through 24 extending in one direction, as shown in FIG. 3, or may be modified in various forms. Referring to FIGS. 6 and 7, according to an exemplary embodiment, the nano pattern 20 may include a plurality of second patterns 26-1 extending in the first direction X, and a plurality of second patterns 26-2 extending in the second direction Y, and the nano pattern 20 may be formed such that the plurality of second patterns 26-1 intersect with the plurality of second patterns 26-1, forming a lattice structure. In the current exemplary embodiment, the plurality of second patterns 26-1 and the plurality of second patterns 26-2 are described as having a linear structure. However, exemplary embodiments are not limited thereto, and the plurality of second patterns 26-1 and the plurality of second patterns 26-2 may have a curved structure.

The lattice structure formed by using the plurality of second patterns 26-1 and the plurality of second patterns 26-2 may have a regular form or an irregular form. As an example, as shown in FIG. 6, a first spacing $Z_1$ between a second pattern 26-11 and a second pattern 26-12, and a second spacing $Z_2$ between the second pattern 26-12 and a second pattern 26-13 may be identical to each other. Additionally, a first spacing $M_1$ between a second pattern 26-21 and a second pattern 26-22 and a second spacing $M_2$ between the second pattern 26-22 and a second pattern 26-23 may be identical to each other. The nano pattern 20 may include a regular lattice structure in which an angle $\alpha_1$ between the second pattern 26-11 and the second pattern 26-21 and an angle $\alpha_2$ between the second pattern 26-12 and the second pattern 26-22 are identical to each other.

As another example, as shown in FIG. 7, the first spacing $Z_1$ between the second pattern 26-11 and the second pattern 26-12 and the second spacing $Z_2$ between the second pattern 26-12 and the second pattern 26-13 may be different from to each other. Additionally, the first spacing $M_1$ between the second pattern 26-21 and the second pattern 26-22 and the second spacing $M_2$ between the second pattern 26-22 and the second pattern 26-23 may be different from each other. Furthermore, the nano pattern 20 may include an irregular lattice structure in which the angle $\alpha_1$ between the second pattern 26-11 and the second pattern 26-21 and the angle $\alpha_2$ between the second pattern 26-12 and the second pattern 26-22 are different from each other.

The nano pattern 20 may be formed on the substrate 10. As described above, the nano pattern 20 may be formed of a same material as that of the substrate 10, or a material different from that of the substrate 10. As an example, as shown in FIG. 3, if the nano pattern 20 includes a same material as that of the substrate 10, the nano pattern 20 may be formed of a material included in the substrate 10, that is, a non-conductor that does not affect an electronic structure of the graphene layer 30 or metal with a weak interaction with the graphene layer 30. Additionally, as shown in FIG. 8, if the nano pattern 20 is formed of a material different from that of the substrate 10, the substrate 10 may be formed of a non-conductor that does not effect an electronic structure of the graphene layer 30, for example, $SiO_2$, $Al_2O_3$, or glass, and the nano pattern 20 may be formed of a metal that interacts with the graphene layer 30, for example, Ni, cobalt (Co), titanium (Ti), Pt, Cu, Ag, Au, or the like.

The nano pattern 20 may be formed of a single material or a plurality of materials. As shown in FIGS. 9A and 9B, a first material included in a first pattern 20-1 may include metal with a weak interaction with the graphene layer 30, for example, Pt, Cu, Ag, Au, or the like. A second material included in a second pattern 20-2 may include metal with a strong interaction with the graphene layer 30, for example, Ni, Co, Ti, or the like. According to an exemplary embodiment, the first pattern 20-1 and the second pattern 20-2 may be alternately disposed. Since phonons included in the graphene layer 30 may be unevenly distributed according to a difference between an interaction between the first material included in the first pattern 20-1 and the graphene layer 30 and an interaction between the second material included in the second pattern 20-2 and the graphene layer 30, heat transfer characteristics may deteriorate.

FIGS. 10A through 10D are cross-sectional conceptual diagrams showing a method of manufacturing a conductor according to an exemplary embodiment.

Figure 10A:
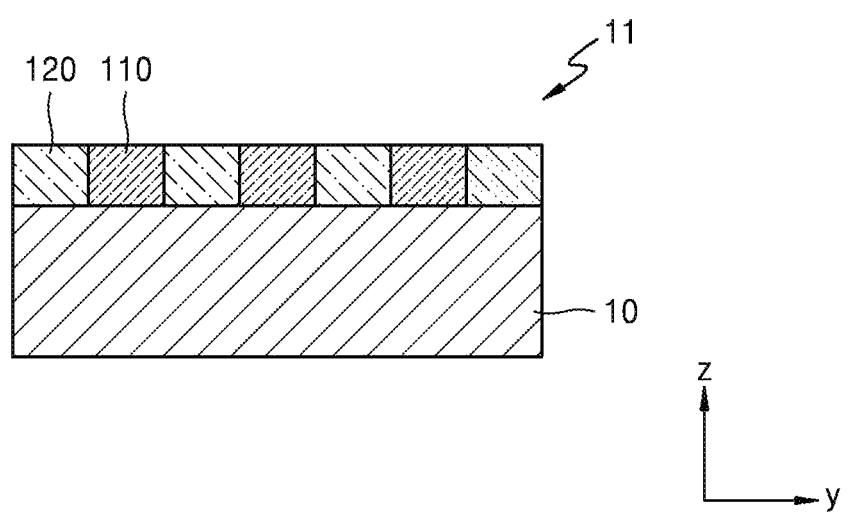
FIGS. 10A through 10D are cross-sectional conceptual diagrams showing a method of manufacturing a conductor according to an exemplary embodiment.

Referring to FIG. 10A, a mask layer 11 may be disposed on the substrate 10. The substrate 10 may be, for example, a silicon substrate. However, as described above, the substrate 10 may include a non-conductor that does not effect an electronic structure of the graphene layer 30, metal with a weak interaction with the graphene layer 30, or the like.

The mask layer 11 may be a polymer layer that includes a same pattern structure as that of the nano pattern 20, for example, a block-copolymer film. As an example, if the mask layer 11 is formed of a block copolymer layer, the mask layer 11 may include first polymer blocks 110 and second polymer blocks 120. The first polymer blocks 110 are disposed in the shape of the desired nano pattern 20, and the second polymer blocks 120 are disposed in areas in which the first polymer blocks 110 are not formed.

Referring to FIG. 10A, an annealing process of applying heat to the block copolymer may be performed so as to remove the first polymer blocks 110. Thus, the first polymer blocks 110 and the second polymer blocks 120 may be phase-separated from each other. Then, the first polymer blocks 110 may be selectively dissolved by performing reactive icon etching by using a developing solvent, while the second polymer blocks 120 are not be dissolved, and thus, the first polymer blocks 110 may be removed. Accordingly, the mask layer 11 may expose, below where the first polymer blocks 120 were formed, a desired shape of the nano pattern 20.

Figure 10B:
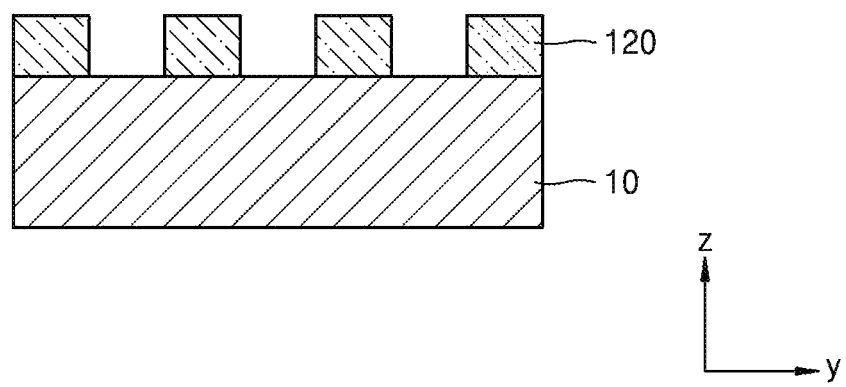
Figure 10C:
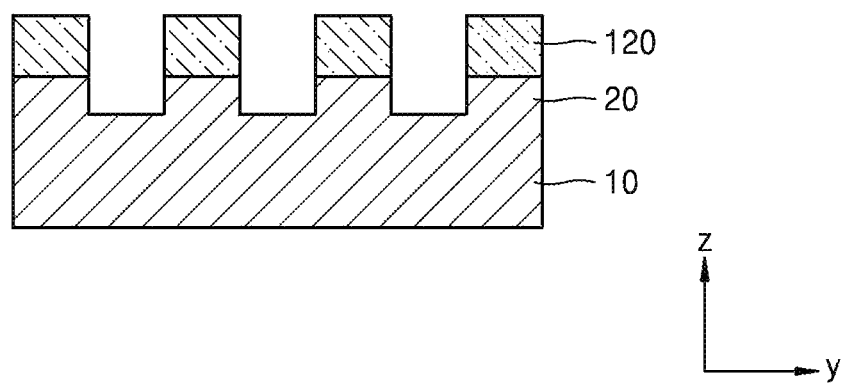

Referring to FIG. 10C, the nano pattern 20 may be formed by performing an etching process on the substrate 10 by using the second polymer blocks 120 as a mask. The etching process may be, for example, plasma etching. For example, a capacitively coupled plasma reactive ion etching process, an inductively coupled plasma reactive ion etching process, or a reactive ion etching process using ion injection bias may be performed. A portions of the substrate 10 in which the second polymer blocks 120 are not disposed may be etched by using the etching process described above. Accordingly, the nano pattern 20 may be formed in the portions of the substrate 10 in which the second polymer blocks 120 are not disposed.

Figure 10D:
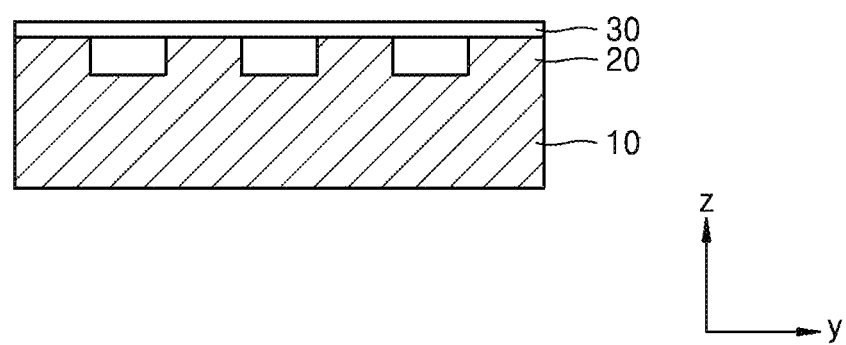

Referring to FIG. 10D, the second polymer blocks 120 are removed from the substrate 10, and the graphene layer 30 may be disposed an upper surface of the nano pattern 20. As an example, the graphene layer 30 may be formed on the nano pattern 20 by using various process such as a chemical vapor deposition method, an inductive coupled plasma enhanced chemical vapor deposition (ICP-PECVD), an atomic layer deposition (ALD) method, or the like.

If the graphene layer 30 is formed by using a method described above, the graphene layer 30 may grow on a catalyst metal film (not shown) that includes at least one material selected from the group consisting of Ni, Co, iron (Fe), Pt, Au, aluminum (Al), chrome (Cr), Cu, magnesium (Mg), manganese (Mn), rhodium (Rh), thallium (Ta), titanium (Ti), tungsten (W), uranium (U), vanadium (V), and zirconium (Zr). The graphene layer 30 is attached to a flexible transfer film (not shown) such as a heat peeling tape or a polymer coating film, and then, the graphene layer 30 is moved to the nano pattern 20. Then, the flexible transfer film is removed, and thus, the graphene layer 30 may be transferred to the nano pattern 20.

FIGS. 11A through 11E are cross-sectional conceptual diagrams showing a method of manufacturing a conductor according to another exemplary embodiment.

Other than operations to be described with reference to FIG. 11D, operations illustrated in FIGS. 11A through 11C and FIG. 11E, such as disposing the mask layer 11 on the substrate 10, removing of a part of the mask layer 11, and forming the nano pattern 20 by performing an etching process on the substrate 10, are substantially identical to the descriptions provided with reference to FIGS. 10A through 10C. Thus, additional descriptions of FIGS. 11A through 11C and FIG. 11E are not provided here.

Figure 11A:
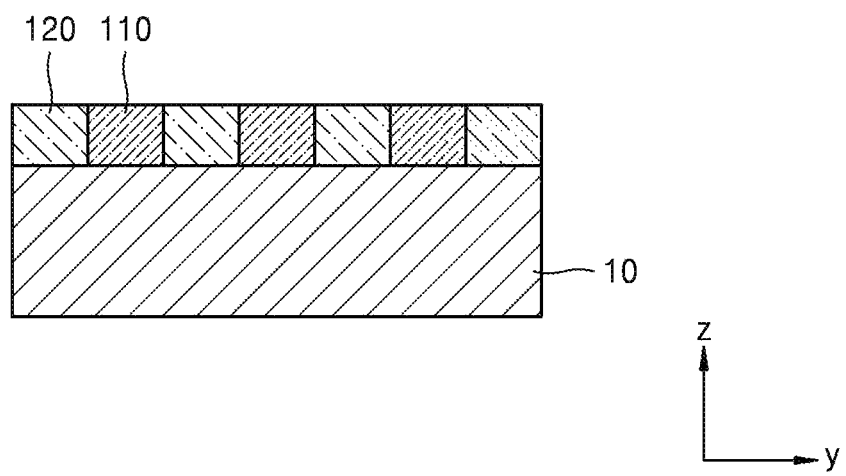
FIGS. 11A through 11E are cross-sectional conceptual diagrams showing a method of manufacturing a conductor according to another exemplary embodiment.
Figure 11B:
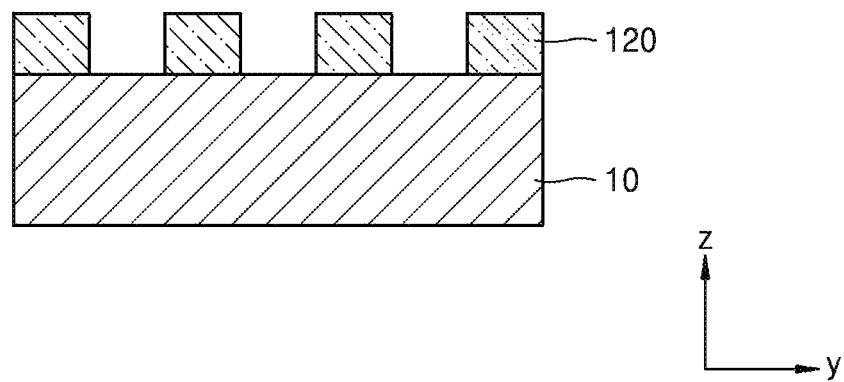
Figure 11C:
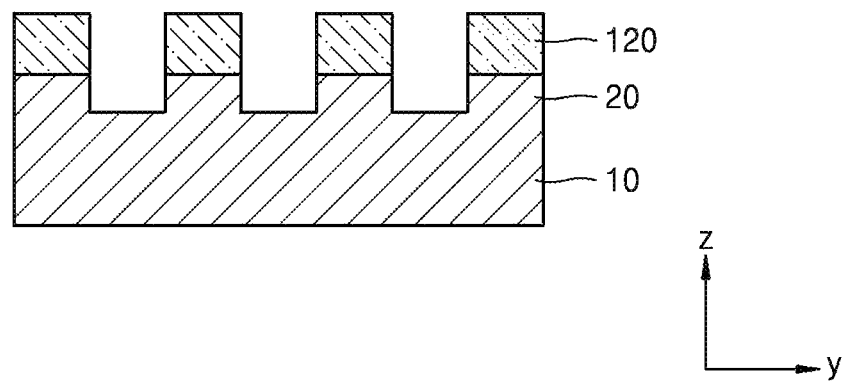
Figure 11D:
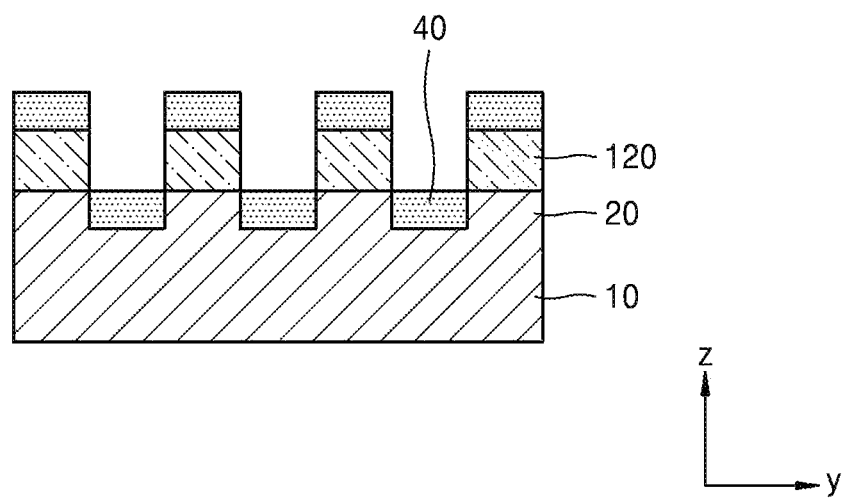

Referring to FIG. 11D, a metal layer 40 is deposited on the second polymer blocks 120 and the portions of the substrate 10 that have been etched. The substrate 10 may include a non-conductor that does not affect an electronic structure of the graphene layer 30, for example, $SiO_2$, $Al_2O_3$, or glass, and the metal layer 40 may include a material that interacts with the graphene layer 30, for example, Pt, Cu, Ag, Au, Ni, Co, Ti, or the like.

Figure 11E:
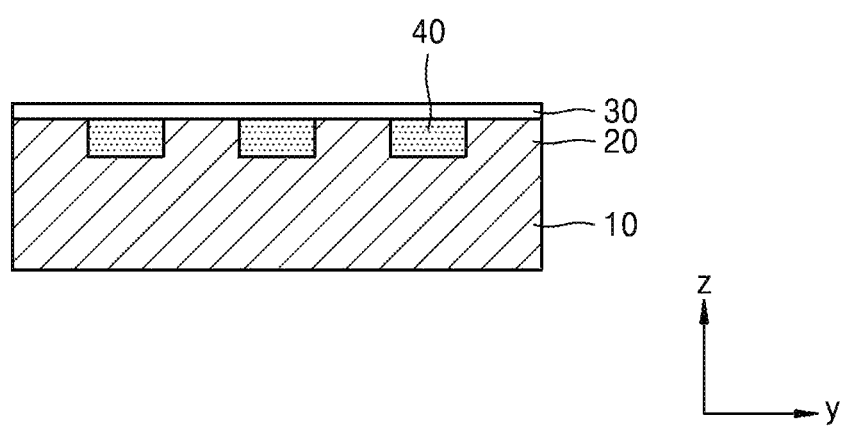

Referring to FIG. 11E, the second polymer blocks 120 are removed from the substrate 10, and the graphene layer 30 is transferred to an upper surface of the nano pattern 20. The portions of the metal layer 40 disposed on the second polymer blocks 120 are removed together with the second polymer blocks 120, and thus, a nano pattern 20 in which the other portions of the metal layer 40 and portions of the substrate 20 which are not etched are alternately arranged may be formed. Then, the graphene layer 30 may be transferred to an upper surface of the nano pattern 20. A description about the transferring of the graphene layer 30 is substantially identical to the description provided with reference to FIG. 10D, and thus, is not provided here.

According to the exemplary embodiments described above, a method is described of forming the nano pattern 20 by etching portions of the substrate. However, exemplary embodiments are not limited thereto. As another example, the nano pattern 20, shown in FIG. 8, may be formed by disposing an additional metal layer that includes metal with a weak interaction with the graphene layer 30, for example, a metal layer that includes Pt, Cu, Ag, Au, or the like between the substrate 10 formed of a non-conductive material and the mask layer 11, and etching portions of the metal layer by using the plurality of polymer blocks 110 and 120.

According to an exemplary embodiment, a conductor whose heat conductivity characteristics deteriorate but electrical characteristics are maintained may be provided by disposing a graphene layer on a nano pattern. Additionally, a conductor that may deteriorate heat transfer characteristics in a particular direction may be provided by changing a shape of a nano pattern on which a graphene layer is disposed.

According to one or more exemplary embodiments, a conductor and a method of manufacturing the same have been described by explaining exemplary embodiments with reference to the attached drawings for the purpose of promoting an understanding of the principles of exemplary embodiments. The exemplary embodiments, described herein, are only examples, and it may be understood by one of ordinary skill in the art that various modifications and changes in the exemplary embodiments may be made.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A conductor comprising:
a substrate;
a nano pattern disposed on the substrate; and
a graphene layer disposed over the nano pattern,
wherein the substrate and the nano pattern comprise a same material; and
wherein the nano pattern and the substrate are an opaque body.

2. The conductor of claim 1, wherein the nano pattern comprises a plurality of linear structures extending in a same direction, wherein each of the plurality of linear structures is spaced apart from each other of the plurality of linear structures.

3. The conductor of claim 1, wherein the nano pattern comprises a plurality of regularly spaced first linear structures, each extending in a first direction, and a plurality of regularly spaced second linear structures, each extending in a second direction, wherein the plurality of first linear structures intersect with the plurality of second linear structures, thereby forming a regular lattice.

4. The conductor of claim 1, wherein the nano pattern comprises a plurality of first linear structures and a plurality of second linear structures, wherein the plurality of first linear structures intersect with the plurality of second linear structures, thereby forming an irregular lattice.

5. The conductor of claim 1, wherein the nano pattern comprises a plurality of first pattern elements and a plurality of second pattern elements alternately arranged with the plurality of first pattern elements.

6. The conductor of claim 5, wherein each of the plurality of first pattern elements comprises at least one of Pt, Cu, Ag, and Au, and each of the plurality of second pattern elements comprises at least one of Ni, Co, and Ti.

7. A conductor comprising:
a substrate;
a nano pattern disposed on the substrate; and
a two-dimensional (2D) material layer disposed over the nano pattern,
wherein the substrate and the nano pattern comprise a same; and
wherein the nano pattern and the substrate are an opaque body.

8. The conductor of claim 7, wherein the 2D material layer comprises at least one of molybdenum disulfide ($MoS_2$) and tungsten disulfide ($WS_2$).

9. A method of manufacturing a conductor, the method comprising:
depositing a mask layer over a substrate;
removing a part of the mask layer thereby forming at least one opening in the mask layer, such that a remaining portion of the mask layer forms a nano pattern;
etching a portion of the substrate through the at least one opening in the mask layer;
removing the remaining portion of the mask layer;
depositing a metal layer over the etched substrate; and
forming a graphene layer over the substrate;
wherein the metal layer comprises at least one of platinum (Pt), copper (Cu), silver (Ag), nickel (Ni), cobalt (Co), and gold (Au),
wherein the metal layer is opaque.

10. The method of claim 9, wherein the mask layer is a block copolymer film comprising a first plurality of polymer blocks and a second plurality of polymer blocks.

11. The method of claim 10, wherein the removing the part of the mask layer comprises removing the first plurality of polymer blocks, and wherein the second plurality of polymer blocks forms the nano pattern.

12. The method of claim 9, wherein the nano pattern comprises a plurality of linear structures extending in a same direction, wherein each of the plurality of linear structures is separated from each other of the plurality of linear structures.

13. The method of claim 9, wherein the nano pattern comprises a regularly-spaced lattice.

14. The method of claim 9, wherein the nano pattern comprises an irregularly-spaced lattice.

15. The method of claim 9, wherein the substrate comprises at least one of silicon dioxide ($SiO_2$), aluminum oxide ($Al_2O_3$), and glass.

* * * * *